United States Patent
Li et al.

(10) Patent No.: US 9,177,759 B2
(45) Date of Patent: Nov. 3, 2015

(54) PROCESSING APPARATUS AND METHOD USING A SCANNING ELECTRON MICROSCOPE

(71) Applicant: Hitachi High-Technologies Corporation, Minato-ku, Tokyo (JP)

(72) Inventors: Wen Li, Tokyo (JP); Ryo Kadoi, Tokyo (JP); Hajime Kawano, Tokyo (JP); Hiroyuki Takahashi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/301,403

(22) Filed: Jun. 11, 2014

(65) Prior Publication Data
US 2015/0041643 A1    Feb. 12, 2015

(30) Foreign Application Priority Data
Aug. 9, 2013  (JP) .................................. 2013-166630

(51) Int. Cl.
*H01J 37/26* (2006.01)
*H01J 37/28* (2006.01)
*H01J 37/147* (2006.01)

(52) U.S. Cl.
CPC ............. *H01J 37/28* (2013.01); *H01J 37/1471* (2013.01); *H01J 37/265* (2013.01); *H01J 2237/151* (2013.01); *H01J 2237/1504* (2013.01); *H01J 2237/1536* (2013.01)

(58) Field of Classification Search
USPC .................. 250/305, 306, 307, 309, 310, 311
See application file for complete search history.

(56) References Cited

U.S. PATENT DOCUMENTS

| | | | |
|---|---|---|---|
| 7,075,078 B2 | 7/2006 | Ose et al. | |
| 7,408,155 B2 | 8/2008 | Oosaki et al. | |
| 2002/0142496 A1 * | 10/2002 | Nakasuji et al. | 438/14 |
| 2003/0102430 A1 * | 6/2003 | Kimura et al. | 250/310 |

FOREIGN PATENT DOCUMENTS

| | | |
|---|---|---|
| JP | 08-045460 A | 2/1996 |
| JP | 2001-283759 A | 10/2001 |
| JP | 2003-513428 A | 4/2003 |
| JP | 2006-093251 A | 4/2006 |
| JP | 2012-249078 A | 12/2012 |
| WO | WO 01/33606 A1 | 5/2001 |

* cited by examiner

*Primary Examiner* — Nicole Ippolito
(74) *Attorney, Agent, or Firm* — Miles & Stockbridge P.C.

(57) ABSTRACT

The present invention provides a processing apparatus using a scanning electron microscope, which includes the scanning electron microscope having an electron optical system radiating and scanning a focused electron beam on a sample placed on a stage to image the sample, and an image processing/control section which controls the scanning electron microscope and processes the image obtained by imaging with the scanning electron microscope. The electron optical system of the scanning electron microscope has image shift electrodes comprised of electrostatic electrodes, the image shift electrodes moving a position at which to apply the focused electron beam onto the sample with the stage stopped to thereby shift a region in which the sample is to be imaged.

10 Claims, 7 Drawing Sheets

PROCESSING APPARATUS AND METHOD USING A SCANNING ELECTRON MICROSCOPE

CLAIM OF PRIORITY

The present application claims priority from Japanese Patent Application JP 2013-166630 filed on Aug. 9, 2013, the content of which is hereby incorporated by reference into this application.

BACKGROUND

The present invention relates to an apparatus (measurement inspection apparatus) for carrying out processing such as measurement, observation or inspection or the like of a sample (object) such as a semiconductor substrate, and a method (measurement inspection method) for carrying out measurement or inspection or the like using the apparatus, etc. The present invention relates particularly to a processing apparatus for imaging a sample and carrying out measurement, observation or inspection on a sample with the use of a scanning electron microscope (SEM), and relates to a method provided for the apparatus.

In a semiconductor manufacturing process, the miniaturization of circuit patterns formed on a semiconductor substrate (wafer) has been rapidly advanced. The importance of process monitoring to monitor such as whether those patterns are formed as designed is increasing more and more. For example, in order to detect the occurrence of abnormalities and failures (defects) in the semiconductor manufacturing process at an early stage or in advance, the measurement and inspection of the circuit patterns or the like on the wafer are carried out at the end of each manufacturing step.

Upon the above measurement/inspection, in a measurement inspection apparatus such as an electron microscope apparatus (SEM) using a scanning electron beam system, and a measurement inspection method corresponding thereto, an electron beam is applied to a target wafer (sample) while being scanned, and energy such as secondary electrons generated thereby is detected. Then, an image (measurement image or inspection image) is generated by signal processing/image processing or the like, based on the above detection, and the measurement, observation or inspection is carried out based on the image.

For example, in the case of a device (inspection device, inspection function) for carrying out the inspection of a defect in each circuit pattern, images of similar circuit patterns are compared with each other using the inspection image, and a point large in the difference therebetween is determined and/or detected as a defect. In the case of a device (measurement device, measurement function) for performing measurement on each circuit pattern, the amount of generation of secondary electrons or the like changes depending on the unevenness (surface shape) of a sample. It is therefore possible to acquire a change in the surface shape of the sample, etc. by evaluation processing of a signal of the secondary electrons. In particular, it is possible to measure the dimension values of the circuit pattern or the like by estimating the position of an edge in the image of the circuit pattern, particularly using that the signal of the secondary electrons is suddenly increased or decreased at the edge portion of the circuit pattern. Further, it is possible to evaluate the quality of processing of the circuit pattern, etc., based on the result of measurement thereof.

Further, in the case of a device (review device) for observing in detail, each defect detected by other inspection apparatus, a defect position is detected by a low-magnification secondary electron image, based on the position coordinates of the defect detected by other inspection apparatus. Then, an enlarged image of the defect is picked up by a high-magnification secondary electron image, and the defect is observed based on the enlarged image. Further, the feature amounts on the image of each defect are extracted from the enlarged image to perform defect classification.

In the measurement apparatus using the scanning electron beam system and the measurement method corresponding thereto, it is essential to move an observation point to each of several tens of inspection/measurement positions on the semiconductor wafer at high speed and improve throughput. A high-speed movable sample stage has therefore been developed, but its position accuracy is about several microns. Mechanically controlling the sample stage in nanometer order is not practical in terms of the moving speed and production cost. To adjust the position of the sample stage with more accuracy, there has normally been adopted an image shift system for electrically moving the scan center coordinates of primary electrons. In this system, the sample stage is fixed. With an electron microscope, a relatively narrow visual field with high magnification is observed in a relatively wide visual field of a low magnification. The relatively narrow visual field is switched by shifting a scanning range of an electron beam.

Thus, in order to acquire the measurement image, the measurement apparatus using the scanning electron beam system needs to be equipped with a deflection scanning function capable of scanning an electron beam with respect to a measurement region lying in a target wafer (sample), and an image shift control function for moving the electron beam to the center of a range targeted for measurement.

There are two types of deflection system, electromagnetic deflection and electrostatic deflection, as a system for position movement and scan control of an electron beam. The electromagnetic deflection system applies a current signal to a coil installed in a column to generate a magnetic field and deflects and controls a passing electron beam by the Lorentz force. On the other hand, the electrostatic deflection system applies a required voltage signal to a multi-electrode electrode plate disposed in a columnar shape to generate an electric field and deflects and controls a passing electron beam by the Coulomb force. When comparing both systems, the electrostatic deflection system that is capacity-load driven has a scan speed that is ten times or more faster as compared with the electromagnetic deflection system that is inductor-load driven, and is used in a high-speed scan. On the other hand, since a mounting space is restricted and the sensitivity of a positional displacement due to electric noise is restricted in the electrostatic deflection system, it is not possible to increase deflection sensitivity (beam moving distance per unit voltage: um/V). Therefore, when the large-view beam movement and the deflection scanning are performed in the electrostatic deflection system, the required deflection voltage is increased.

An electron beam scanning system in a measurement inspection apparatus such as SEM according to a related art example and a method therefor will be described below. For example, a normal scan in a CD-SEM (critical dimension SEM) is called a TV scan or a raster scan or the like. Further, a scan having an n-fold increase in speed with respect to the TV scan is called an n-fold speed scan or the like.

A raster scan system or a TV scan system according to a related art example is accompanied by a problem that a difference occurs in the electrostatic charge quantity of a sample according to the shape or the like of each pattern formed on the sample. That is, a problem arises in that the accuracy of the observation, i.e., measurement or inspection of the surface condition of the sample is degraded, or it becomes impossible, like such as a reduction in image contrast or disappearance of the edge of each circuit pattern in an image obtained by detecting secondary electrons.

To cope with the above problem that the accuracy of the measurement/inspection is degraded, it is effective to shorten the irradiation time per unit region, i.e., decrease an irradiation charge density and reduce the electrostatic charge quantity of the sample or make it appropriate. To this end, raising the irradiation scanning speed of the electron beam like an n-fold speed or providing high-speed scanning is effective. Here, the electrostatic deflection system may be adopted to provide the electron beam deflection scanning function, thereby the high-speed scanning is provided.

Related art examples each related to the above measurement/inspection and electron beam control, there are known technologies described in JP-2006-093251-A (Patent Document 1), Republished Patent Publication No. WO01/033606 (Patent Document 2), JP-2001-283759-A (Patent Document 3), JP-1996-45460-A (Patent Document 4), JP-2012-249078-A (Patent Document 5), etc.

Patent Document 1 describes a technology or the like which measures pattern dimensions at a desired position on a cross sectional shape of each pattern. Patent Document 1 has described a dimension measuring method, comprising: acquiring a secondary electron image of a sample using a scanning electron microscope; creating an image profile of a pattern to measure its dimensions within the acquired secondary electron image using the secondary electron image; retrieving a model profile most matching with an image profile created out of a plurality of model profiles respectively corresponding to a plurality of patterns obtained from respective secondary electron images of a plurality of patterns already known in cross-sectional shape and dimensions stored in advance and different in shape; and determining the size of each pattern using information about the model profile obtained by retrieval. Patent Document 1 also describes an apparatus provided for the method.

Patent Documents 2 and 3 describes a method or the like as regards image shift control, in which even when the amount of movement by an image shift is large, the resolution and dimensional measurement accuracy are high.

Patent Document 4 describes that a response delay of a deflection position of an electron beam in an electron beam lithography apparatus is corrected accurately and at high speed.

Further, Patent Document 5 describes a driver integrated circuit which includes a differential input circuit, a level shift circuit and an output circuit divided. These circuits are arranged in three or more chips different in substrate potential so that an output voltage larger than a process breakdown voltage can be acquired.

SUMMARY

A schematic configuration of a measurement inspection apparatus (system) 80 using a related art scanning electron beam system is shown in FIG. 8. The measurement inspection apparatus (system) 80 is roughly comprised of a scanning electron microscope 8100 and a computer 8200.

The scanning electron microscope 8100 has a lens barrel 8120 and a sample chamber 8130. Inside the lens barrel 8120 are provided as an irradiation system (electron optical system), an electron gun 8101 which emits an electron beam A81, a focusing lens (first condenser lens) 8102 through which the emitted electron beam A81 passes, a diaphragm 8103, a focusing lens (second condenser lens) 8104, a blanking control electrode 8105, an aperture 8106, scanning electrodes 8108, image shift coils 8111, an objective lens 8109, etc. Further, the lens barrel 8120 has as a detection system, a detector 8107 which detects a secondary electron A811 generated from a sample 110 by the radiated electron beam A81 (A84).

The computer 8200 includes an overall control unit 8210, a blanking (BLK) control circuit 8201, an image/shift control unit 8202, a deflection control unit 8203, a mechanism system control unit 8230, a signal detecting unit (secondary electron signal detecting circuit) 8207, an image processing unit (secondary electron signal processing unit) 8208, a stage position detecting unit 8209, an electron optical system control unit 8220, a GUI unit (user interface unit) 8250, etc.

Inside (vacuum) the lens barrel 8120, the electron beam A81 generated and emitted from the electron gun 8101 is focused through the first condenser lens (focusing lens) 8102, the diaphragm 8103 and the second condenser lens (focusing lens) 8104. The electron beam A81 is subjected to the movement to its irradiation center and scanning deflection control through the scanning electrodes 8108 and the image shift coils 8111 and then applied onto the sample 110 through the objective lens 8109 or the like while scanning over the sample 110. When irradiated with the beam A81 (A84), the secondary electron A811 is generated from the sample 110 and detected by the detector 8107. The signal (analog signal) detected by the detector 8107 is converted into a digital signal by the signal detecting unit 8207 (secondary electron signal detecting circuit). Then, a two-dimensional image is generated and processed by the image processing unit 8208 (secondary electron signal processing circuit) based on the digital signal. The result of its processing is displayed on the screen of the GUI unit 8250. A circuit pattern is measured based on the image (in the case of the measuring function).

The GUI unit 8250 performs a process for providing a user (measurer/inspector) with an interface (GUI screen or the like). The GUI unit 8250 provides a GUI screen for inputting (setting) an inspection condition or the like, a GUI screen for displaying an inspection result (two-dimensional image or the like), etc.

The overall control unit 8210 performs a process for controlling the entirety of the present system (apparatus) in accordance with instructions issued at the GUI unit 8250. The electron optical system control unit 8220 controls the electron optical system (irradiation system) in the lens barrel 8120 in accordance with the control from the overall control unit 8210. The mechanism system control unit 8230 controls a mechanism system including a motor 8131 which drives a stage (sample table) 8112 placed in the sample chamber 8130. A rotation signal of the motor 8131 is sent to the stage position detecting unit 8209, where information about the position of the stage 8112 is obtained.

In the measurement inspection apparatus 80 using the related art scanning electron beam system such as shown in FIG. 8, the electromagnetic system using the image shift coils 8111 as image shift controlling means has been adopted as described in Patent Document 2, for example.

Here, the relationship between the scanning electrodes 8108 and the image shift coils 8111 is placed in such a relationship as shown in FIG. 9. The scanning electrodes 8108 deflect the beam A84 in response to signals c81 and c82 sent from the deflection control circuit 8203 controlled by the overall control unit 8210 to scan over the sample 110. The image shift coils 8111 shift the beam A84 in response to signals b81 and b82 sent from the image shift control circuit 8202 controlled by the overall control unit 8210.

In the example described in Patent Document 2, the moving amount at the image shift is a few tens of μm, and the settling time of the beam from the conventional position to the state in which the next measurement image is acquired takes 10 ms or more. This poses an obstacle for an improvement in throughput in such a situation that the pattern measurement apparatus needs to enhance measurement accuracy and the improvement in throughput with the micro-fabrication of the semiconductor process and 450 mm size enlargement.

Further, in the measurement inspection apparatus 80 using the related art scanning electron beam system such as shown in FIG. 8, the measurement image is acquired in the stopped state of the stage to reduce an influence on the measurement accuracy by a variation in the position of the stage. Each time the measurement point changes, it is necessary to wait until the stage is completely stopped. This waiting time also poses an obstacle for throughput improvement. Further, since vibrations or drift occurs even if the stage is stopped, they pose an obstacle in improving resolution.

If it is possible to observe the position and vibrations or drift during the movement of the stage by a sensor and correct a beam position using an image shift function, throughput and resolution can be improved. In order to provide it, however, the response speed of an image shift needs a few tens of kHz or more. It is difficult for the related art electromagnetic type image shift to provide such a response speed.

The image shift function of electrically deflecting a primary electron beam and moving an observation visual filed in an arbitrary direction by an arbitrary amount is a function indispensable to CDSEM for which many measurement points are set and throughput enhancement is required. When the image shift is carried out, an aberration is generated corresponding to an image shift amount in the direction of the image shift, thus causing degradation in resolution. This resolution degradation poses a problem not negligible for CDSEM which needs to acquire a high-magnification scan image in high resolution.

Further, with the evolution of a semiconductor device, the need to measure a deep groove pattern is expected. In order to measure the deep groove pattern, there is a need to apply a high acceleration voltage of greater than or equal to several times the acceleration voltage as compared with the related art CDSEM. With an increase in the acceleration voltage, the deflection sensitivity of an electron beam is reduced. It is essential to apply a deflection voltage of several times or more to provide the same width of visual field.

Incidentally, the above Patent Document 1 does not describe the problem that the accuracy of measurement/inspection is degraded due to the response delay of the image shift and the stage's drift, and means for solving the problem, etc.

Although Patent documents 2 and 3 have described the method or the like in which even when the amount of movement by the image shift is large, the resolution and dimensional measurement accuracy are high, it does not disclose solving means related to the response delay problem of the image shift, etc.

Patent Document 4 has disclosed the configuration that the ground of a sub DAC smaller in output than a main DAC but fast in settling time is made to float from the atmosphere and superposed on the output of the main DAC. Here, the sub DAC needs to be capable of bearing the maximum output voltage of the main DAC in principle. Above configuration is made with a view toward shortening a deflection waiting time for electron beam exposure and enhancing the throughput of the electron beam lithography apparatus. Patent Document 4 does not however disclose a specific means for allowing the sub DAC to provide a high breakdown voltage and speeding-up.

The present invention aims to provide a processing apparatus and method using a scanning electron microscope, which solves the problem of the response delay of the image shift in the above related art and which has a beam control/correction function capable of simply correcting an aberration generated due to the movement of a beam in a large visual field for the image shift and thereby performs processing such as measurement, observation or inspection or the like of each pattern formed on a semiconductor substrate (wafer).

In order to solve the above problems, the present invention provides a processing apparatus using a scanning electron microscope, including the scanning electron microscope having an electron optical system radiating and scanning a focused electron beam on a sample placed on a stage to image or pick up the sample, and an image processing/control section which controls the scanning electron microscope and processes an image obtained by imaging with the scanning electron microscope. In the processing apparatus, the electron optical system of the scanning electron microscope has image shift electrodes comprised of electrostatic electrodes, the image shift electrodes moving a position at which to apply the focused electron beam onto the sample with the stage stopped to thereby shift a region in which the sample is to be imaged.

Further, in order to solve the above problems, the present invention provides a processing method using a scanning electron microscope, including the steps of radiating and scanning an electron beam focused on a sample placed on a stage by an electron optical system of the scanning electron microscope to image the sample, and processing an image obtained by imaging with the scanning electron microscope. In the processing method, the scanning by irradiating with the electron beam focused by the electron optical system of the scanning electron microscope includes moving a position at which to apply the focused electron beam onto the sample with the stage stopped by using image shift electrodes comprised of electrostatic electrodes to thereby shift a region in which the sample is to be imaged.

According to a representative embodiment of the present invention, an apparatus and a method of a scanning electron beam system, for measuring and inspecting a semiconductor (sample) are capable of correcting in real time, a deflection aberration in image shift and a beam positional displacement caused by vibrations and drift of a stage with the realization of shortening of a response delay in image shift and a waiting time for the stop of the stage, thereby achieving speeding-up of measurement/inspection (high throughput) and an improvement in accuracy.

These features and advantages of the invention will be apparent from the following more particular description of preferred embodiments of the invention, as illustrated in the accompanying drawings.

DESCRIPTION OF THE PREFERRED EMBODIMENTS

Figure 1:
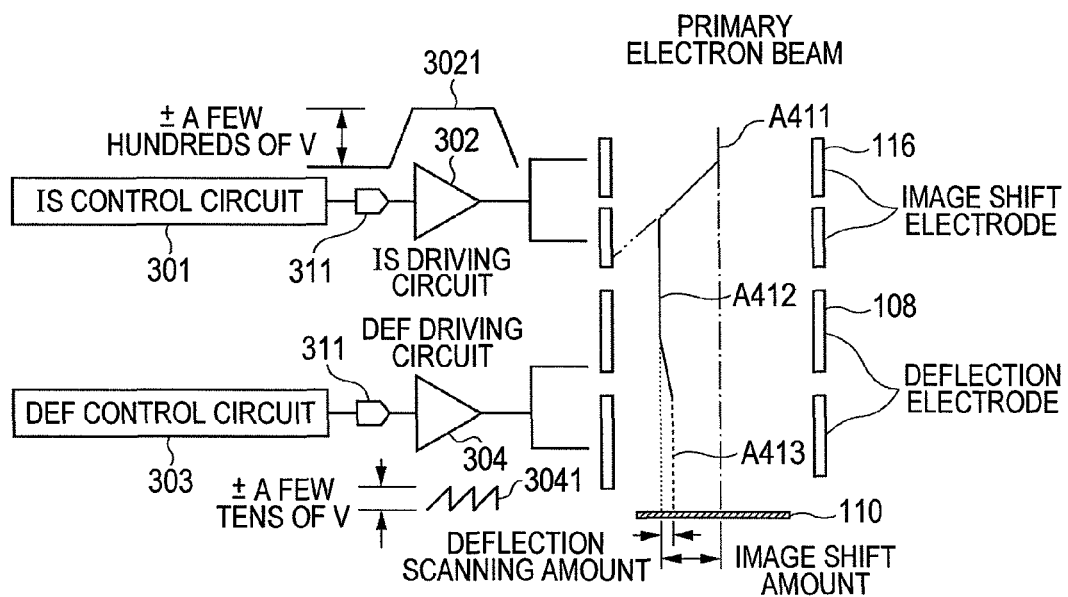
FIG. 1 is a block diagram showing a combination of electrostatic type image shift electrodes and deflection electrodes according to a first embodiment of the present invention.

Preferred embodiments of the present invention will hereinafter be described in detail based on the accompanying drawings. Incidentally, in all drawings for explaining the embodiments, the same components will be identified by the same reference numerals in principle and their repetitive description will be omitted. A measurement, observation and inspection apparatus and a measurement, observation and inspection method hereinafter includes any one of measurement, observation and inspection or a combination of them.

The measurement, observation and inspection apparatus according to the present invention has the function of controlling the measurement corresponding to high throughput and high resolution and provides means for solving problems such as a delay in response of an electron beam used in a stage moving on measuring points and an image shift function, aberrations caused by an image shift, and deterioration in resolution caused by vibrations or drift of the stage, which become problems in that case.

In the present invention, an electrostatic deflection system has been adopted in image shift means in order to achieve an improvement in throughput and solve a response delay of an image shift. Further, there has been provided a driver circuit which generates a position correction signal of an electron beam for correcting an aberration caused by an image shift, and a positional displacement caused by vibrations or drift of the stage. The driver circuit drives a voltage signal in which a high voltage image shift control voltage, a high-speed scan control voltage signal and an aberration/position correction signal required to control the electrostatic electrodes are superposed on each other. Thus, a high-speed and high-accuracy measurement has been provided.

Embodiments to be described below will explain a combination with deflection electrodes where an electrostatic deflection system is adopted in image shift means for shifting the orbit of a primary electron beam emitted from an electron source from the optical axis of an electronic optical system. There are two types of configurations: the image shift means and deflection electrodes are respectively formed by other electrodes; and a configuration in which the image shift means and deflection electrodes are integrated with each other.

First Embodiment

The present embodiment will explain the combination with the deflection electrodes where the electrostatic deflection system is adopted in the image shift means, and the configuration in which the image shift means and the deflection electrodes are respectively formed by other electrodes.

Figure 2:
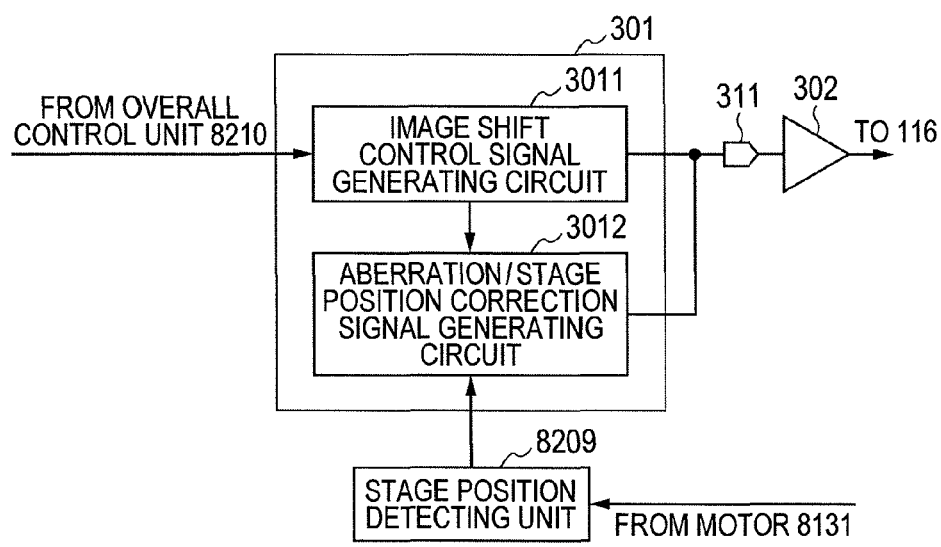
FIG. 2 is a block diagram illustrating a configuration of an image shift control circuit for the electrostatic type image shift electrodes according to the first embodiment of the present invention.

The configuration of a measurement, observation and inspection apparatus using a scanning electron microscope in the present embodiment is the same as the configuration of the measurement inspection apparatus of the related art scanning electron beam system described in FIG. 2 except for the image shift means and its control circuit section, and the deflection electrodes.

In the electrostatic deflection system, deflection electrodes of at least two stages are normally required to control deflections in two intersecting directions (X and Y directions) independently of each other. When deflection scanning of an electron beam and an image shift thereof are operated using different deflection electrodes, deflection electrodes of at least four stages are required.

Patent Document 2 describes the combination of the image shift coils of the electromagnetic deflection system, that is of the prior art system, and the electrostatic type deflection scanning electrodes. The image shift coils and the deflection scanning electrodes in Patent Document 2 can be arranged in the relation between inside and outside with respect to each other as described in FIG. 8. However, when the electrostatic type image shift electrodes and the electrostatic type deflection scanning electrodes are combined as in the present embodiment, they cannot be arranged in the relation between inside and outside with respect to each other, thus resulting in a configuration in which they are arranged up and down each other as shown in FIG. 1. Incidentally, there is shown in FIG. 1, a configuration in which electrodes opposite to each other are arranged up and down in two pairs as image shift electrodes 116 for convenience of display, but the upper pair and the lower pair are deviated by 180° from each other in direction upon their implementation. Further, deflection electrodes 108 of upper and lower two pairs are also similar in configuration.

Figure 8:
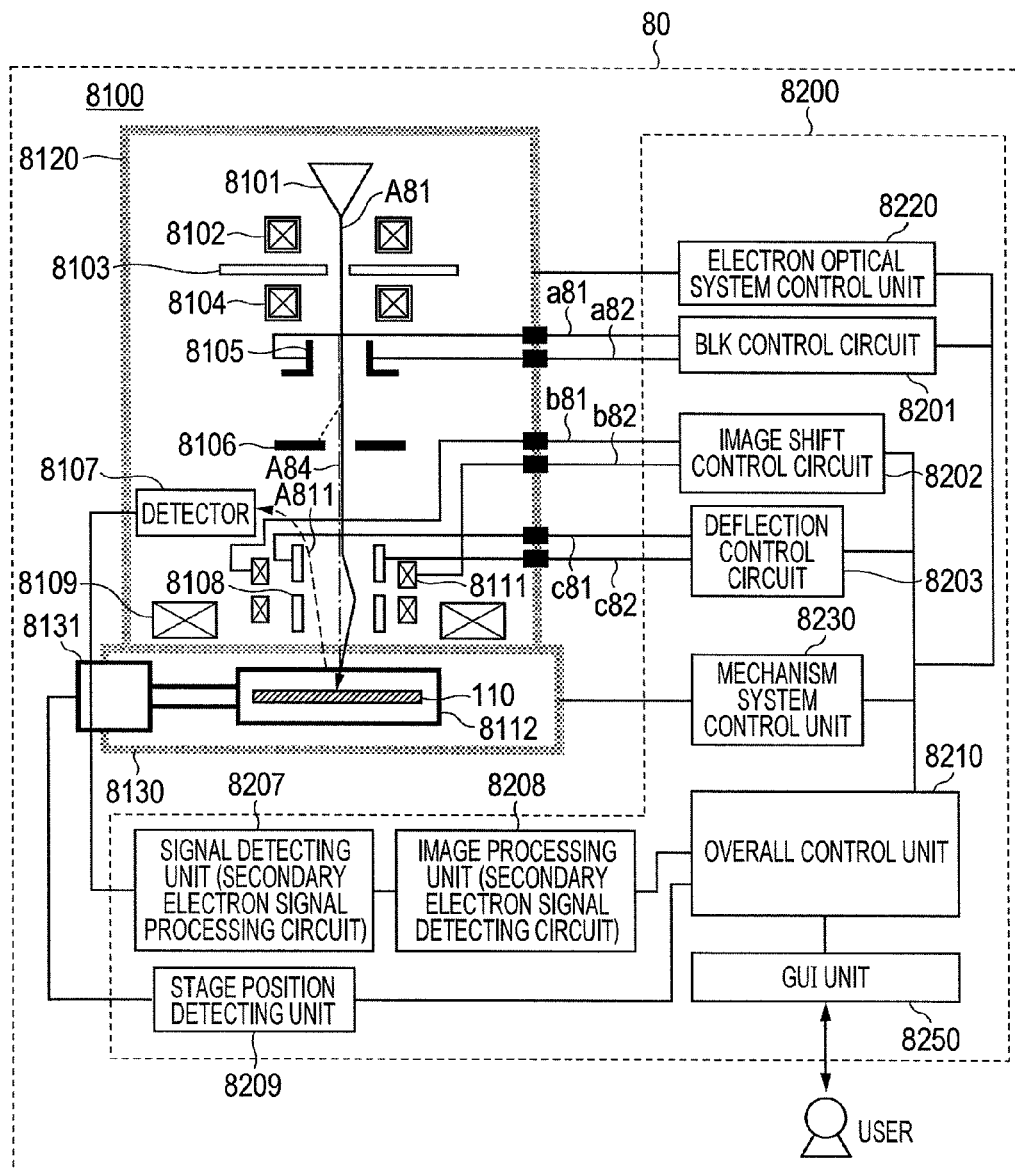
FIG. 8 is a block diagram depicting a configuration of the entire system including a semiconductor measurement inspection apparatus of a related art scanning electron beam system.
Figure 9:
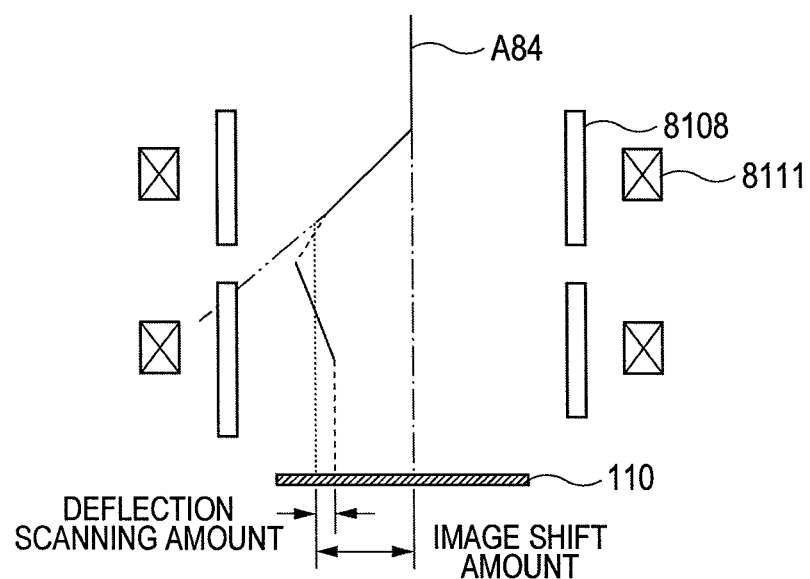
FIG. 9 is a block diagram showing an arrangement configuration of conventional image shift coils and electrostatic deflection electrodes.

The measurement inspection apparatus of the scanning electron beam system in the present embodiment is a substitution of the scanning electrodes 8108 and the image shift coils 8111, and the image shift control circuit 8202 and the deflection control circuit 8203 in the configuration of the measurement inspection apparatus of the related art scanning electron beam system described in FIG. 8 with such a configuration as shown in FIG. 1.

The operation of the measurement inspection apparatus in the present embodiment will be described by referring the apparatus configuration shown in FIG. 8. Inside the lens barrel 8120 (vacuum), an electron beam A411 (in FIG. 1) generated and emitted from the electron gun 8101 is focused through the first condenser lens (focusing lens) 8102, diaphragm 8103 and second condenser lens (focusing lens) 8104 and travels in an electric field formed by the image shift electrodes 116 and the deflection electrodes 108 in FIG. 1, which are replaced with the conventional scanning electrodes 8108 and the image shift coils 8111 in FIG. 8. In the electric field formed by the image shift electrodes 116 in FIG. 1, the orbit of the electron beam A411 is shifted from the optical axis (axis indicated by one-dot chain line in FIG. 1) of the electron optical system to the position of A412. Then, the electron beam A411 advances in an electric field formed by the deflection electrodes 108 controlled by a sawtooth wave-like voltage, where scan deflection control for shifting the electron beam to the position of A413 is performed according to the sawtooth wave-like voltage. Thereafter, the electron beam is applied to the sample 110 while scanning over the sample 110 through the objective lens 8109 and the like.

When the beam A413 is applied, a secondary electron A811 is generated from the sample 110 and detected by the detector 8107. A signal (analog signal) output from the detector 8107 by the detection of the secondary electron A811 is converted into a digital signal by the signal detecting unit 8207 (secondary electron signal detecting circuit). Then, a two-dimensional image is generated and processed by the image processing unit 8208 (secondary electron signal processing circuit), based on the digital signal, followed by being displayed on the screen of the GUI unit 8250. A circuit pattern is measured based on the image (in the case of the measuring function). Thus, when the image shift function is used, it is possible to shift the imaging position on the sample while the sample is stopped (kept stably) at one place and not moving.

When in such a configuration as shown in FIG. 1, an image shift driving circuit (IS driving circuit) 302 is controlled by an image shift control circuit (IS control circuit) 301 to apply a voltage having a peak value of a few hundreds of volts (V) in the form of a trapezoidal waveform like 3021 to the image shift electrodes 116, the orbit of a primary electron beam A411 emitted from an electron gun 8101 is shifted to the position of A412 by the electric field generated between the image shift electrodes 116. When a deflection driving circuit (DEF driving circuit) 304 is controlled by a deflection control circuit (DEF control circuit) 303 in this state to apply a voltage having a peak value of a few tens of volts (V) in the form of a sawtooth wave-like waveform like 3041 to the deflection electrodes 108, the primary electron beam A411 is shifted to the position of A413 relative to the orbit of A412 according to the electric field by the electric field generated between the deflection electrodes 108.

Incidentally, in the configuration shown in FIG. 1, the combination of the image shift control circuit 301 and the image shift driving circuit 302 corresponds to the image shift control circuit 8202 for controlling the image shift coils 8111 in the configuration shown in FIG. 8. Further, the combination of the deflection control circuit 303 and the deflection driving circuit 304 corresponds to the deflection control circuit 8203 in the configuration shown in FIG. 8.

When the image shift electrodes and the scanning electrodes are disposed up and down, their deflection fulcrums are different from each other, and two error sources generated by the deflection of the primary electron beam exist. In the present embodiment, the errors generated by the deflection of the primary electron beam are adjusted by combining control of the image shift driving circuit (IS driving circuit) 302 by the image shift control circuit (IS control circuit) 301 shown in FIG. 1 and control of the deflection driving circuit (DEF driving circuit) 304 by the deflection control circuit (DEF control circuit) 303.

Incidentally, the combination of the image shift control circuit (IS control circuit) 301 and the image shift driving circuit (IS driving circuit) 302 in FIG. 1 corresponds to the image shift control circuit 8202 described in FIG. 8. The combination of the deflection control circuit (DEF control circuit) 303 and the deflection driving circuit (DEF driving circuit) 304 corresponds to the deflection control circuit 8203 described in FIG. 8. The numeral 311 in FIG. 1 denotes a D/A (digital/analog) converter.

In such a configuration, the accuracy of measurement is reduced (degraded) due to the aberration of the primary beam A411 caused by the image shift by the image shift electrodes 116, and the positional displacement caused by vibrations or drift of a stage 8112. In the present embodiment, in order to prevent degradation in the measurement accuracy, the image shift control circuit 301 is configured so as to be driven by a voltage signal, which is obtained by superposing a high voltage image shift control voltage necessary to generate a position correction signal of an electron beam and control the image shift electrodes 116, and an aberration/position correction signal on each other.

The configuration of the image shift control circuit 301 according to the present embodiment is shown in FIG. 2. The image shift control circuit 301 is provided with an image shift control signal generating circuit 3011 and an aberration/stage position correction signal generating circuit 3012. The image shift control signal generating circuit 3011 generates a high voltage image shift control voltage in response to a signal sent from an overall control unit. The aberration/stage position correction signal generating circuit 3012 corrects an aberration of the electron beam A411 and a positional displacement caused by vibrations or drift of a stage 8112 in response to a detection signal of the stage position detecting unit 8209 and a control signal generated by the image shift control signal generating circuit 3011. Here, the stage position detecting unit 8209 receives the signal from the motor 8131 for driving the stage 8112. A signal obtained by superposing the signals from the image shift control signal generating circuit 3011 and the aberration/stage position correction signal generating circuit 3012 on each other is inputted to the image shift driving circuit 302 through the D/A converter 311.

With the image shift control circuit 301 being configured in the above-described manner, it is possible to prevent the accuracy of measurement from being reduced (degraded) due to the aberration of the primary beam A411 caused by the image shift by the image shift electrodes 116 and the positional displacement caused by the vibrations or drift of the stage 8112. A high accurate measurement can be provided in the configuration in which the electrostatic type image shift electrodes and the electrostatic type deflection scanning electrodes are combined.

A sample measuring or inspecting method using the measurement inspection apparatus of the scanning electron beam system according to the present embodiment will next be described using the flow diagram shown in FIG. 3.

First, the motor 8131 is controlled by the mechanism system control unit 8230 to move the stage 8112 and thereby place a region of the sample 110 to be observed in the center of an observation visual field of the scanning electron microscope 8100 (S301). In this state, a voltage applied to the image shift electrodes 116 by the image shift control circuit 8202 is set to zero and a voltage signal having a sawtooth wave-like waveform is applied to the deflection electrodes 108 by the deflection control circuit 8203 so that the electron beam A411 is applied to and scanned on the corresponding region centering on the center of the observation visual field of the scanning electron microscope 8100 to pick up a high-magnification image in this region (S302). Then, the image obtained by imaging is processed (measured or inspected) (S303).

It is next checked whether the next region to be observed exists (S304). When the next observation region is found to exist (when the answer is YES at S304), it is determined whether the next observation region exists in a low-magnification relatively wide observation visual field of the scanning electron microscope 8100 (S305). When the next observation region is determined to exist in the relatively wide observation visual field (when the answer is YES at S305), the scanning range of the electron beam is shifted such that the next observation region takes the center of the visual field, without moving the stage 8112 (image shift: S306). That is, the voltage applied to the image shift electrode 116 by the image shift control circuit 8202 is controlled (peak value 3021 of the voltage applied to the image shift electrodes 116 by the image shift driving circuit 302 is changed) based on information about the center position of the next observation region from the overall control unit 8210 as described using FIG. 1 to thereby shift the orbit of the electron beam A411 to the position of A412 in FIG. 1, for example.

In this state, a voltage signal having a sawtooth wave-like waveform is applied to the deflection electrodes 108 by the deflection control circuit 8203 so that the electron beam A411 is applied to and scanned on the corresponding region centering on the position of A412 shifted by the image shift electrodes 116 to observe a high-magnification image in this region (S307). Then, the image obtained by imaging is processed (measured or inspected) (S308).

Further, when the next observation region exists in the low-magnification relatively wide observation visual field of the scanning electron microscope 8100, the beam is shifted to the center position of the next observation region as with the above to enable acquisition of a high-magnification image in this region.

On the other hand, when the next observation region does not exist in the low-magnification relatively wide observation visual field of the scanning electron microscope 8100 (when the answer is NO at S305), the method returns to S301 where the motor 8131 is controlled by the mechanism system control unit 8230, based on information about the position of the next observation region from the overall control unit 8210 to move the stage 8112 so as to place the next observation region in the center of the observation visual field of the scanning electron microscope 8100 and thereby perform such imaging by the scanning electron microscope 2100 as described above.

Further, when it is determined at S304 that the next observation region does not exist (when the answer is NO), the work is terminated.

According to the present embodiment as above, since the image shift and the scanning of the electron beam are both executed using the electrostatic electrodes, it is possible to solve the problem about the response delay of the image shift and achieve an improvement in throughput.

Second Embodiment

A measuring apparatus of a scanning electron beam system according to a second embodiment of the present invention, and a measurement inspection method using the same will be described using FIGS. 4 through 6 while comparing with an example of the conventional art.

The present embodiment provides means in which image shift electrodes and scanning electrodes are integrated where the image shift electrodes and the scanning electrodes are respectively made up of electrostatic electrodes. An image shift function for moving a beam in a large visual field and a beam deflection scanning function for a narrow visual field are implemented using the integrated electrostatic electrodes.

A beam movement distance for an image shift is about ten times the beam scanning range under a high-magnification imaging condition at the time of measurement of a pattern dimension. If the same deflection sensitivity is taken, a control voltage necessary for the image shift is 10 times the control voltage necessary for the deflection scanning. On the other hand, a deflection scanning waveform for an electrostatic deflection system needs a few MHz or more. When a settling time for the image shift is shortened to ¹⁄₁₀₀ of a conventional 10 ms, the required frequency is a few hundreds of kHz.

To integrate the image shift electrodes and the scanning electrodes, a big problem must be solved. In order to simultaneously implement the beam scanning control function and the image shift function by the same electrodes, the primary electron beam is required to be controlled with the same deflection sensitivity. At this time, in order to provide an image shift wide in visual field about 10 ten times at the maximum, the control voltage needs ten times the scanning deflection voltage. On the other hand, the highest speed (frequency) must satisfy a few MHz or more that is a frequency for deflection scanning. Therefore, the driver circuit for driving the integrated image shift electrodes and deflection scanning electrodes in the present embodiment is configured such that a high voltage of greater than or equal to ten times the convention voltage can be added while maintaining the high speed necessary for the conventional deflection scanning of electron beam.

The operation of the difference in configuration between the conventional art example and the second embodiment will be described below.

[Measurement Inspection Apparatus (System)]

Figure 4:
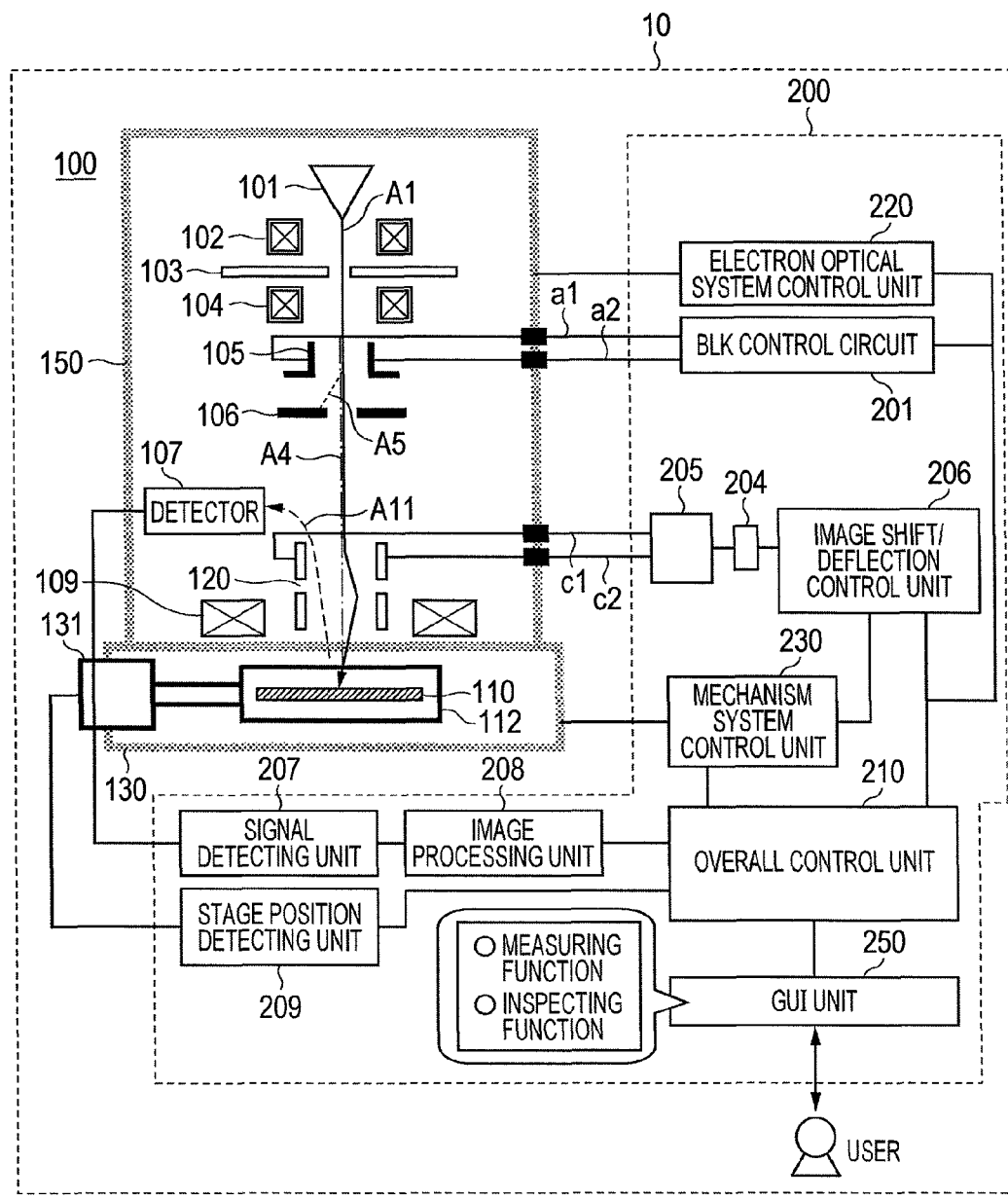
FIG. 4 is a block diagram showing a schematic configuration of an apparatus using electrodes in which electrostatic type image shift electrodes and deflection electrodes according to a second embodiment of the present invention are integrated to each other.

A configuration of the entire system including the measurement inspection apparatus according to the second embodiment is shown in FIG. 4. The measurement inspection apparatus 10 according to the second embodiment is an application example which enables automatic measurement and inspection of a target semiconductor wafer (sample 110). The present measurement inspection apparatus 10 has the measuring function that measures a dimensional value of each circuit patter in the semiconductor wafer (sample 110) and the inspecting function that detects defects (abnormalities and failures) in the same pattern.

The present measurement inspection apparatus (system) 10 is roughly comprised of a scanning electron microscope 100 and a computer 200 for signal processing/control.

The scanning electron microscope 100 is provided with a column 150 and a sample chamber 130. A sample table 112 (stage) on which the sample 110 being a target for measurement/inspection is placed, and a motor 131 which drives the stage 112, are installed inside the sample chamber 130.

There are provided inside the column 150 (vacuum) of the scanning electron microscope 100 as an irradiation system (electron optical system), an electron gun 101 which emits an electron beam A1, a focusing lens (first condenser lens) 102 through which the emitted electron beam A1 passes, a diaphram 103, a focusing lens (second condenser lens) 104, a blanking control electrode 105, an aperture 106, an integrated deflector (electrode) 120 which controls an image shift and deflection scanning, an objective lens 109, etc. The column 100 includes as a detection system, a detector 107 which detects a secondary electron A11 emitted from the sample 110 by the emitted electron beam A1 (A4).

The computer 200 is configured to be stored in, for example, a control rack in the form of a PC or a control board or the like. The individual parts of the computer 200 are implemented by, for example, software program processing by a processor and a memory or the like, or processing of a dedicated circuit, etc.

The computer 200 includes an overall control unit 210, a blanking (BLK) control circuit 201, an image shift/deflection control unit 206 which controls the position shift of the electron beam and deflection scanning, a mechanism system control unit 230, a signal detecting unit (secondary electron signal detecting circuit) 207, an image processing unit (secondary electron signal processing unit) 208, a GUI unit (user interface unit) 250, etc.

In the column 150 (vacuum) of the scanning electron microscope 100, the electron beam A1 generated and emitted from the electron gun 101 is focused through the first condenser lens (focusing lens) 102, the diaphragm 103 and the second condenser lens (focusing lens) 104. The electron beam A1 is subjected to movement to its irradiation center and scanning deflection control through the image shift/scanning integrated deflector 120. Then, the electron beam A1 is applied onto the sample 110 through the objective lens 109 or the like while scanning over the sample 110. When irradiated with the beam A1 (A4), a secondary electron A11 is generated from the sample 110 and detected by the detector 107. The signal (analog signal) detected by the detector 107 is converted into a digital signal by the signal detecting unit 207 (secondary electron signal detecting circuit). Then, a two-dimensional image is generated and processed by the image processing unit 208 (secondary electron signal processing circuit) based on the digital signal, followed by being displayed on a GUI screen. A circuit pattern is measured based on the image (in the case of the measuring function).

The GUI unit 250 performs a process for providing a user (measurer/inspector) with an interface (GUI screen or the like). The GUI unit 250 provides a GUI screen for inputting (setting) an inspection condition or the like, a GUI screen for displaying an inspection result (two-dimensional image or the like), etc. The GUI unit 250 includes an input/output device such as a keyboard, a display or the like, a communication interface unit, etc. The user is able to select and execute the measuring function and the inspecting function on the GUI screen.

The overall control unit 210 performs a process for controlling the entirety (electron optical system control unit 220, mechanism system control unit 230, image shift/deflection control unit 206, signal detecting unit 207, image processing unit 208, stage position detecting unit 209, etc.) of the present system (apparatus) in accordance with instructions issued at the GUI unit 250. For example, the overall control unit 210 controls the electron optical system control unit 220, the image shift/deflection control unit 206, the mechanism system control unit 230 and the like according to measurement/inspection conditions and instructions, etc. inputted by the user on the screen of the GUI unit 250 to thereby perform processing for measurement. For example, for execution of the measurement, the overall control unit 210 receives data information such as the two-dimensional image or the like generated through the signal processing unit 207 and the image processing unit 208 and displays it on the screen of the GUI unit 250.

The electron optical system control unit 220 controls an electron optical system (irradiation system), which includes components such as the electron gun 101, first condenser lens (focusing lens) 102, diaphragm 103, second condenser lens (focusing lens) 104, blanking control electrode 105, objective lens 109, etc. in the column 100, in accordance with the control from the overall control unit 210. When the blanking control circuit 201 controls the blanking control electrode 105 via signal lines (a1 and a2) to stop irradiation of the sample 110 with the electron beam A1, the blanking control circuit 201 bends the orbit of the electron beam A1 and allows the aperture 106 to be irradiated with the electron beam A4.

The image shift/deflection control unit 206 applies a deflection control signal to the deflector 120 through signal lines (c1 and c2) according to the control from the overall control unit 210 to thereby shift the position of the electron beam and control scanning by deflection at the shifted position.

The mechanism system control unit 230 controls a mechanism system including the motor 131 for driving the stage 112 installed in the sample chamber 130, etc. For example, the mechanism system control unit 230 is capable of driving the motor 131 while being associated with the scanning control of the electron beam to thereby move and control the stage 112. At this time, a rotation signal of the motor 131 is sent to the stage position detecting unit 209, where information about the position of the stage 112 is obtained.

Incidentally, the computer 200 (overall control unit 210 or the like) shown in FIG. 4 is provided with both of the measuring function and the inspecting function, but may be in the form of being provided with only one. In the case of measurement (measuring function), the image processing unit 208 generates a measurement image and performs the calculation of pattern dimension values in the image, etc. In the case of inspection (inspecting function), the image processing unit 208 generates an inspection image and performs the process of detecting and determining defects in the image, etc.

[Image Shift/Deflection Control Unit]

Figure 5:
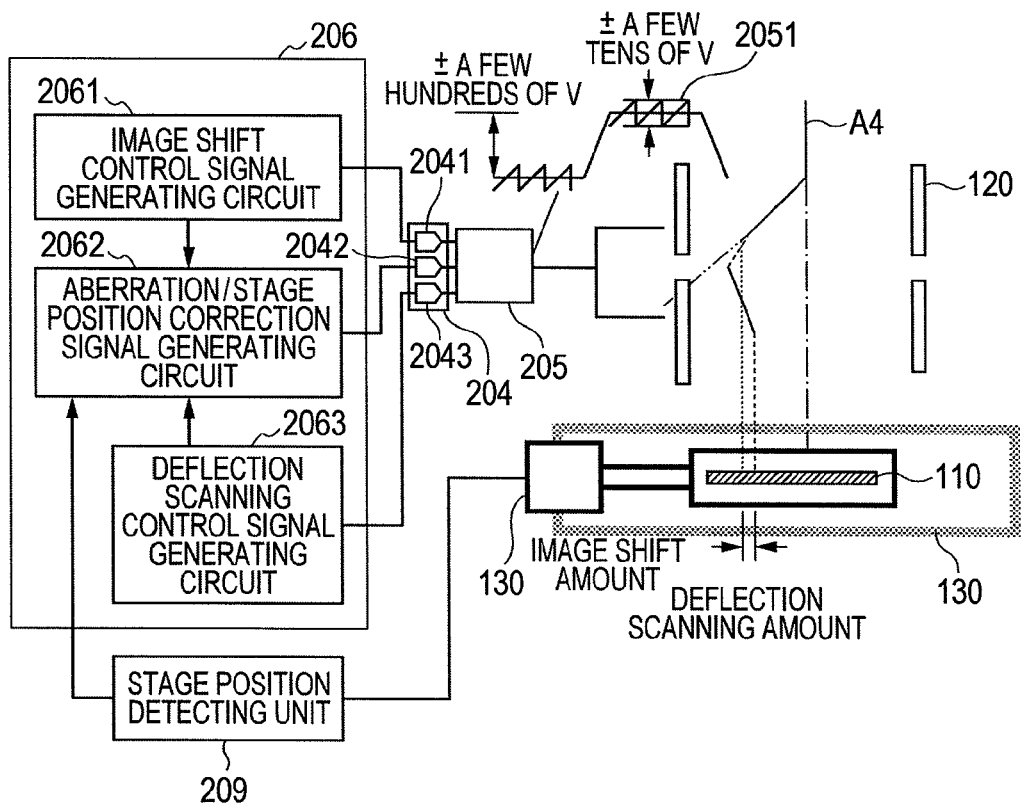
FIG. 5 is a block diagram illustrating a configuration of an image shift deflection control section in the apparatus using the electrodes in which the electrostatic type image shift electrodes and deflection electrodes according to the second embodiment of the present invention are integrated to each other.

As shown in FIG. 5, the image shift/deflection control unit 206 is provided with an image shift control signal generating circuit 2061, a deflection scanning control signal generating circuit 2063 and an aberration/stage position correction signal generating circuit 2062. The image shift control signal generating circuit 2061 generates a necessary image shift voltage signal waveform in accordance with the amount of movement of the electron beam up to the center point of its measurement range relative to the sample and its deflection sensitivity. The deflection scanning control signal generating circuit 2063 generates a beam scanning control voltage waveform for acquiring a measurement image by the electron beam according to the scanning speed of the electron beam, the irradiation range of a pattern targeted for measurement and its deflection sensitivity. The aberration/stage position correction signal generating circuit 2062 calculates a correction amount of a voltage signal applied to the integrated deflector (electrode) 120, which is a multi-electrode electrostatic electrode, such that an error in aberration generated by the deflection of a large visual field for the image shift and a positional displacement in stage become minimum according to conditions such as an image pickup magnification, a scanning speed, a scanning range and the like.

The image shift control signal generating circuit 2061, the deflection scanning control signal generating circuit 2063 and the aberration/stage position correction signal generating circuit 2062 respectively convert the generated image shift voltage signal, scanning voltage signal and correction voltage signal into analog signals by respective digital/analog converters (D/A converters) 2041 through 2043 of D/A converter section 204, which in turn are added together by an image shift/scanning deflection driver circuit 205. The so-added signal 2051 is applied to the image shift/scanning integrated deflector 120.

[Driver Circuit]

Figure 6:
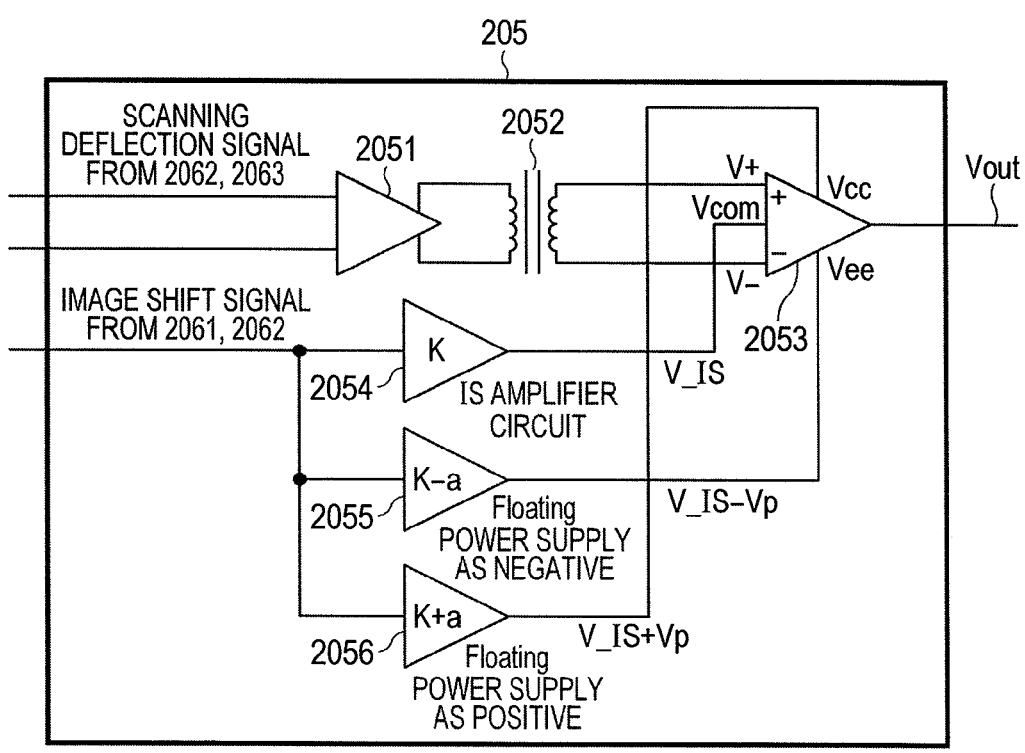
FIG. 6 is a block diagram showing a configuration of a driver circuit in the apparatus using the electrodes in which the electrostatic type image shift electrodes and deflection electrodes according to the second embodiment of the present invention are integrated to each other.

A specific example of the driver circuit 205 for driving the image shift/scanning integrated deflector 120 in the present embodiment will next be shown using FIG. 6.

As described above, the image shift voltage control signal necessary for the electron beam to move to the measuring point is not less than a few tens of kHz and a few hundreds of V. On the other hand, the voltage signal to control the electron beam scanning for acquiring the image of the measurement pattern is not less than a few MHz and a few tens of V. It is difficult for the normal driver circuit to drive a signal of not less than a few hundreds of V and a few MHz.

The driver circuit 205 in the present embodiment shown in FIG. 6 is configured in such a manner that a power supply voltage signal and a common voltage signal of a high-speed driver 2053 placed in floating is made variable according to a control voltage necessary for the image shift. The driver circuit 205 drives a high voltage/high speed signal of not less than a few hundreds of V and a few MHz required.

The voltage signals (scanning deflection signals) shown in FIG. 5 that need the high-speed electron beam scanning, which are inputted from the deflection scanning control signal generating circuit 2063 and the aberration/stage position correction signal generating circuit 2062 in the image shift/deflection control unit 206, are inputted to the high-speed driver 2053 via a scan voltage signal generator driver 2501 which amplifies the voltage signal and an isolator 2052 such as an optical insulation transducer.

On the other hand, the image shift signal output from the image shift control signal generating circuit 2061 of the image shift/deflection control unit 206 is inputted to an amplifier 2054 for amplifying the image signal, an amplifier 2055 that serves as a floating negative power supply, and an amplifier 2056 that serves as a floating positive power supply. A high voltage image shift control voltage signal (IS) amplified by the amplifier 2054 is inputted as a common voltage or offset or ground voltage for the high-speed driver 2053. A voltage (IS+Vp) slightly increased from the sum of the image shift voltage (IS) and the maximum scanning control voltage is generated by the amplifier 2056 and supplied as a positive power supply for the high-speed driver 2053. Similarly, a voltage (IS−Vp) slightly reduced from the difference between the image shift voltage and the maximum scanning control voltage is generated by the amplifier 2055 and supplied as a negative power supply for the high-speed driver 2053.

With such a configuration of the driver circuit 205, the power supply voltage and ground voltage of the high-speed driver 2053 are determined by the maximum/minimum values of the image shift voltage (IS) and the scanning voltage signal. An output voltage signal (Vout) obtained by superposing the image shift voltage signal and the scanning voltage signal on each other can fall within a range of the positive/negative power supply voltage of the high-speed driver 2053 ((IS−Vp)<Vout<(IS+Vp)). It is therefore possible to output a high-speed scanning signal voltage without causing a problem associated with a breakdown voltage. Thus, since the high-speed driver 2053 of the driver circuit 205 is configured to be controlled by the floating voltages, the image shift control and the beam scan (deflection scan) control can be stably achieved within the range of the breakdown voltage of the high-speed driver 2053.

Figure 3:
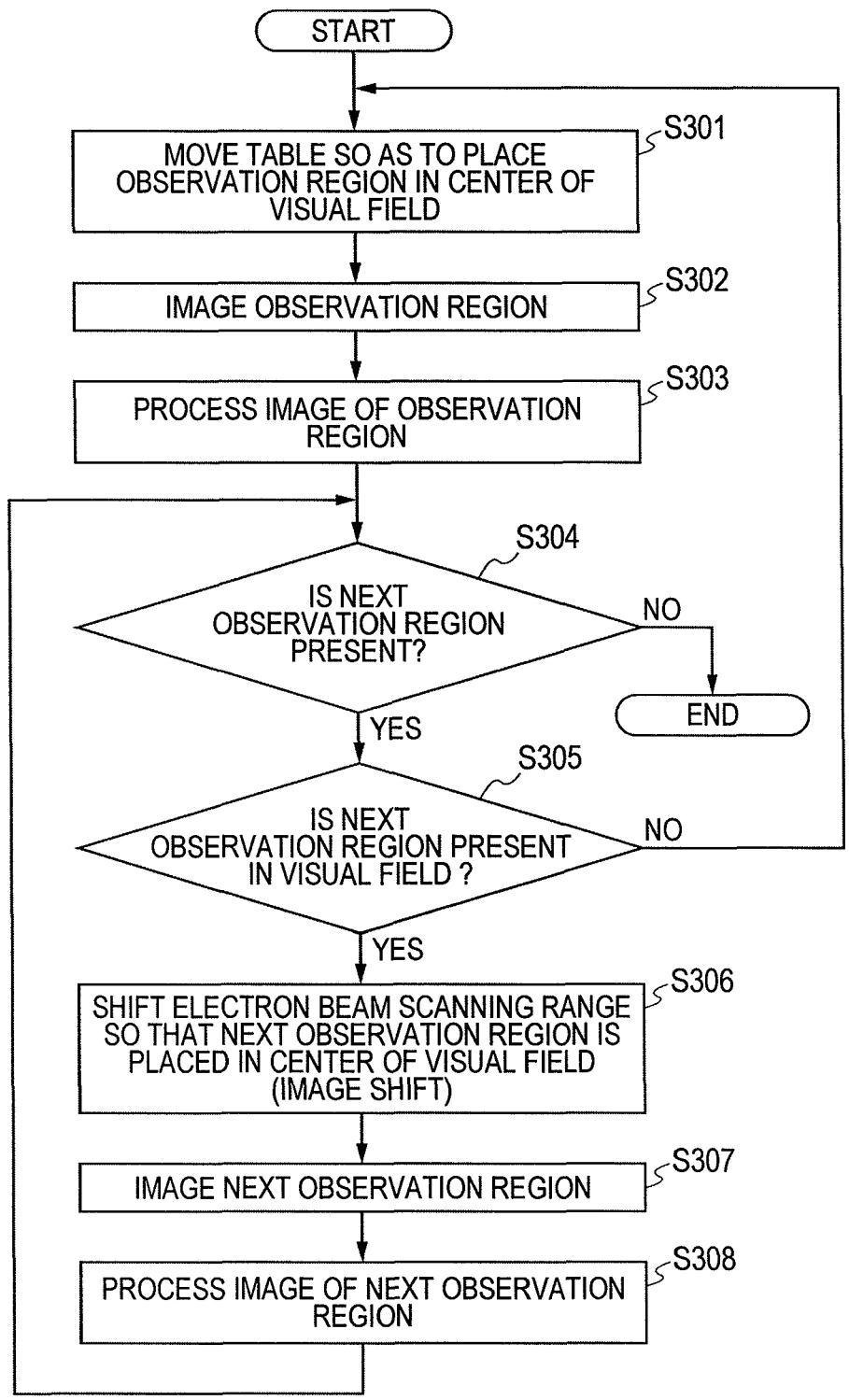
FIG. 3 is a flow diagram depicting the flow of the operation of imaging a sample by a scanning electron microscope using the electrostatic type image shift electrodes according to the first embodiment of the present invention and processing an image of the sample.

Since the method for measuring or inspecting the sample using the measurement inspection apparatus of the scanning electron beam system according to the present embodiment is the same as the processing flow described using FIG. 3 in the first embodiment except for Step S306, the description of Steps identical to those in the processing flow will be omitted.

The present embodiment is different from the first embodiment in that at Step S306, the integrated deflector 120 is controlled by the image shift/deflection control circuit 206 and the driver circuit 205 such as shown in FIGS. 5 and 6 to perform the image shift and the scanning deflection.

According to the present embodiment, in the scanning electron beam system, throughput and measurement accuracy with regard to the apparatus and method for the measurement/inspection of the semiconductor (sample) are improved. The response delay in image shift and the waiting time for the stage stopping are shortened. Moreover, the deflection aberration in the image shift and the beam positional displacement, which is caused by the vibrations and drift of the stage, are corrected in real time. It is thus possible to achieve an increase in the speed of measurement/inspection and high accuracy for the measurement/inspection.

Third Embodiment

The second embodiment has explained the configuration in which the high-speed driver 2053 of the driver circuit 205 is controlled by the floating voltages to stably provide the image shift control and the beam scan (deflection scanning) control within the range of the breakdown voltage of the high-speed driver 2053. In contrast, the third embodiment will explain a configuration that the driver circuit 205 is comprised of a circuit in which transistors are connected in tandem. Each of the image shift and the beam scan is controlled at a voltage higher than the breakdown voltage of each individual transistor.

Since the configuration of a measurement inspection apparatus of a scanning electron beam system according to the present embodiment is the same as the configuration shown in FIG. 4 described in the second embodiment except for the driver circuit 205, the description of those similar to the second embodiment will be omitted.

Figure 7:
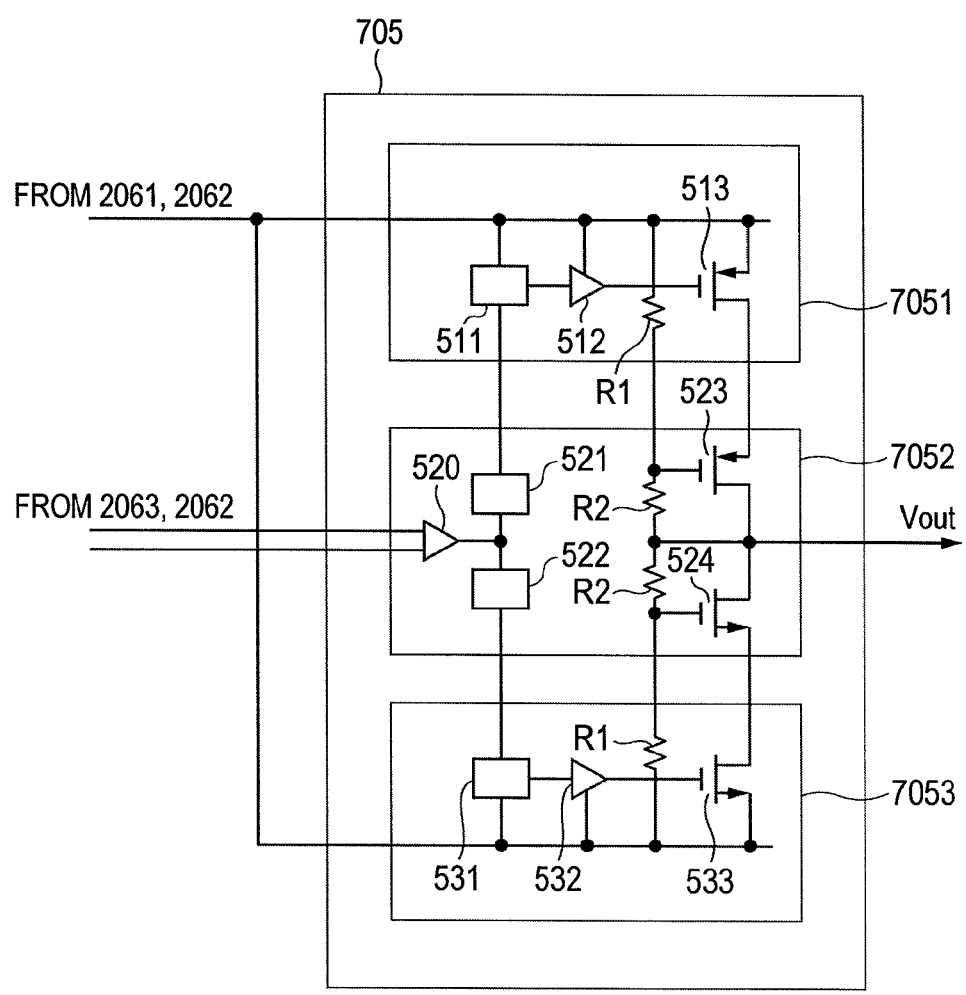
FIG. 7 is a block diagram illustrating a configuration of a driver circuit in an apparatus using electrodes in which electrostatic type image shift electrodes and deflection electrodes according to a third embodiment of the present invention are integrated to each other.

In the present embodiment, a driver circuit 705 comprised of a plurality of transistors is adopted as shown in FIG. 7 instead of the driver circuit 205 described in the second embodiment. The example in FIG. 7 shows a circuit configured by using three transistors. In the configuration, each of the image shift and the beam scan is controlled at a voltage higher than the breakdown voltage of each individual transistor by using the plural transistors in tandem connection. For example, a configuration described in FIG. 2 or 5 of Patent Document 4 can be used for the above.

In the configuration shown in FIG. 7, the signals output from the image shift control signal generating circuit 2061 and the aberration/stage value correction signal generating circuit 2062 of FIG. 5 described in the second embodiment and converted in analog form through the D/A converters 2041 and 2042 respectively are inputted to their corresponding transistors 7051 and 7052. On the other hand, the signals output from the aberration/stage value correction signal generating circuit 2062 and the deflection scanning control signal generating circuit 2063 in FIG. 5 and converted in analog form through the D/A converters 2041 and 2042 respectively are inputted to the transistor 7052.

The signals inputted to the transistor 7052 are inputted to and amplified by a differential input circuit part 520. Of the signals output from the differential input circuit part 520, the signal inputted to a level shift circuit 521 is inputted to a level shift circuit 511 on the transistor 7051 side as a high-level gate input, which in turn becomes a gate input for a transistor 513 on the high level side through a buffer 512. On the other hand, the signal inputted to a level shift circuit 522 is inputted to a level shift circuit 531 on the transistor 7053 side as a low-level gate input, which in turn becomes a gate input for a transistor 533 on the low level side through a buffer 532.

The operating state of each of the transistors 513, 523, 524 and 533 and current flowing therethrough are controlled according to the magnitude of the signals of the level shift circuit on the high level side and the level shift circuit on the low level side to control an output voltage Vout.

For example, if the differential input signal is of a positive signal, the transistors 513 and 523 of an output stage are brought into an on state, and the transistors 524 and 533 are brought into an off state. The output voltage Vout approaches the power supply voltage of the transistor 513. On the other hand, if the differential input signal is of a negative signal, the transistors 513 and 523 of the output stage are brought into an off state, and the transistors 524 and 533 are brought into an on state. The output voltage Vout approaches the power supply voltage of the transistor 533.

Thus, the necessary Vout signal is output according to input signals and differential input signals: the input signals are sent from the image shift control signal generating circuit 2061 and the aberration/stage value correction signal generating circuit 2062; and the differential input signals are sent from the aberration/stage value correction signal generating circuit 2062 and the deflection scanning control signal generating circuit 2063.

According to the present embodiment, the drive circuit can be formed relatively compact because of being formed by the transistors, thus circuit mounting can be made easy.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

The invention claimed is:

1. A processing apparatus using a scanning electron microscope, comprising:
    the scanning electron microscope having an electron optical system for imaging a sample, the electron optical system radiating and scanning a focused electron beam on the sample placed on a stage; and
    an image processing/control section which controls the scanning electron microscope and processes an image obtained by imaging with the scanning electron microscope,
    wherein the electron optical system of the scanning electron microscope has image shift electrodes comprised of electrostatic electrodes, the image shift electrodes moving a position at which to apply the focused electron beam onto the sample with the stage stopped to thereby shift a region in which the sample is to be imaged,
    wherein each of the image shift electrodes comprised of the electrostatic electrodes has a function of a deflection electrode for scanning the electron beam, and
    wherein the image processing/control section has an image shift deflection control unit which outputs a signal to the image shift electrodes, the output signal being obtained by superposing an image shift control signal and a deflection signal for deflecting the electron beam on each other.

2. The processing apparatus according to claim 1,
    wherein the image processing/control section applies a signal to the image shift electrodes, the applied signal correcting an aberration of the electron beam generated by shifting the imaging region of the sample with the image shift electrodes, the applied signal also correcting a positional displacement of the stopped stage.

3. The processing apparatus according to claim 1, wherein the electron optical system has deflection electrodes which scan the electron beam, and
    the image processing/control section has an image shift control unit controlling the image shift electrodes and a deflection control unit controlling the deflection electrodes.

4. The processing apparatus according to claim 1,
    wherein the image shift deflection control unit has a high-speed driver having a frequency of more than 1 MHz and a deflection signal input part, the high-speed driver being placed in floating from a common ground of the apparatus and generating the image shift control signal, the deflection signal input part inputting the deflection signal for deflecting the electron beam to the high-speed driver via an isolator which isolates the driver from the deflection signal generator based on the common ground of the apparatus.

5. The processing apparatus according to claim 1, wherein the image shift deflection control unit has circuits divided and arranged on a plurality of substrates different in substrate potential.

6. A processing method using a scanning electron microscope, comprising the steps of:
    radiating and scanning a focused electron beam on a sample placed on a stage by an electron optical system of the scanning electron microscope to image the sample;
    inputting a signal to the image shift electrodes comprised of the electrostatic electrodes, the input signal being obtained by superposing an image shift control signal and a deflection signal for deflecting the electron beam on each other;
    controlling the focused electron beam with the image shift electrodes; and
    thereby shifting the imaging region of the sample and scanning the shifted imaging region by the deflection signal; and
    processing an image obtained by imaging with the scanning electron microscope,
    wherein the radiating and scanning with the electron beam focused by the electron optical system of the scanning electron microscope includes moving a position at which to apply the focused electron beam onto the sample with the stage stopped by using image shift electrodes comprised of electrostatic electrodes to thereby shift a region in which the sample is to be imaged.

7. The processing method according to claim 6, further comprising the steps of:
    correcting an aberration of the electron beam, the aberration of the electron beam being generated by shifting the imaging region of the sample with the image shift electrodes comprised of the electrostatic electrodes; and
    correcting a positional displacement of the stopped stage.

8. The processing method according to claim 6, further comprising the steps of:
    deflecting the focused electron beam with deflection electrodes with the imaging region of the sample shifted by the image shift electrodes;
    scanning the imaging region of the sample; and
    thereby imaging the shifted imaging region.

9. The processing method according to claim 6, further comprising the steps of:
    generating the image shift control signal with a high-speed driver having a frequency of more than 1 MHz placed in floating from a common ground of the apparatus;

inputting the deflection signal to the high-speed driver through an isolator which isolates the driver from the deflection signal generated based on the common ground of the apparatus the deflection signal deflecting the electron beam;

inputting a signal to the image shift electrodes, the input signal being obtained by superposing the image shift control signal and the deflection signal on each other, and thereby controlling the image shift electrodes comprised of electrostatic electrodes.

10. The processing method according to claim 6, further comprising the step of controlling the image shift electrodes using circuits divided and arranged on a plurality of substrates different in substrate potential.

* * * * *